United States Patent
Rahimo et al.

(10) Patent No.: US 12,211,903 B2
(45) Date of Patent: Jan. 28, 2025

(54) SEMICONDUCTOR DEVICE AND METHOD FOR DESIGNING THEREOF

(71) Applicant: mqSemi AG, Zug (CH)

(72) Inventors: Munaf Rahimo, Gaensbrunnen (CH); Iulian Nistor, Niederweningen (CH)

(73) Assignee: MQSEMI AG, Zug (CH)

( * ) Notice: Subject to any disclaimer, the term of this patent is extended or adjusted under 35 U.S.C. 154(b) by 422 days.

(21) Appl. No.: 17/829,168

(22) Filed: May 31, 2022

(65) Prior Publication Data

US 2022/0384577 A1  Dec. 1, 2022

(51) Int. Cl.
| | | |
|---|---|---|
| H01L 29/10 | (2006.01) | |
| H01L 27/07 | (2006.01) | |
| H01L 29/06 | (2006.01) | |
| H01L 29/423 | (2006.01) | |
| H01L 29/739 | (2006.01) | |
| H01L 29/78 | (2006.01) | |

(52) U.S. Cl.
CPC ...... *H01L 29/1095* (2013.01); *H01L 29/0619* (2013.01); *H01L 29/0696* (2013.01); *H01L 29/42364* (2013.01); *H01L 29/7397* (2013.01); *H01L 27/0727* (2013.01); *H01L 29/7811* (2013.01); *H01L 29/7813* (2013.01)

(58) Field of Classification Search
CPC ............. H01L 29/1095; H01L 29/0619; H01L 29/0696; H01L 29/42364; H01L 29/7397; H01L 29/7811; H01L 29/7813; H01L 27/0727
USPC ........................................................ 257/288
See application file for complete search history.

(56) References Cited

U.S. PATENT DOCUMENTS

| | | | |
|---|---|---|---|
| 2004/0119117 A1 | 6/2004 | Kushida | |
| 2021/0104614 A1* | 4/2021 | Rahimo | ............... H01L 29/4236 |
| 2021/0202724 A1* | 7/2021 | Rahimo | ............... H01L 29/0623 |

FOREIGN PATENT DOCUMENTS

GB        2587646 A        4/2021

OTHER PUBLICATIONS

GB Search Report dated Oct. 28, 2021 for GB Application No. 2107761.5.

* cited by examiner

*Primary Examiner* — Igwe U Anya
(74) *Attorney, Agent, or Firm* — Tarolli, Sundheim, Covell & Tummino LLP

(57) ABSTRACT

A semiconductor device with an active transistor cell comprising a p-doped first and second base layers, surrounding an n type source region, the device further comprising a plurality of first gate electrodes embedded in trench recesses, has additional fortifying p-doped layers embedding the opposite ends of the trench recesses. The additional fortifying layers do not affect the active cell design in terms of cell pitch i.e., the design rules for transistor cell spacing, or hole drainage between the transistor cells, but reduce the gate-collector parasitic capacitance of the semiconductor, hence leading to optimum low conduction and switching losses. To further reduce the gate-collector capacitance, the trench recesses embedding the first gate electrodes can be formed with thicker insulating layers in regions that do not abut the first base layers, so as not to negatively impact the value of the threshold voltage.

19 Claims, 8 Drawing Sheets

C-C`

B-B`

A-A`

SEMICONDUCTOR DEVICE AND METHOD FOR DESIGNING THEREOF

CROSS-REFERENCE TO RELATED APPLICATIONS

The present application claims priority to GB Patent Application No. 2107761.5 filed on 31 May 2021. The entirety of this application is hereby incorporated by reference for all purposes.

FIELD OF THE INVENTION

The invention relates to the field of semiconductor devices. More particularly it relates to a semiconductor device with multiple transistor unit cells, comprising layers of different conductivity types and multiple trench gate electrodes.

BACKGROUND

Improving the electrical performance of semiconductors based on Metal Oxide Semiconductor interfaces and respective inversion or depletion layer channels requires the miniaturization of dimensions at transistor cell level, combined with preserving a reasonable large channel width, to reduce losses. In particular, for power semiconductors like IGBTs and MOSFETs, various transistor active cell designs have been proposed with the goal of improving the electron-hole concentration (plasma concentration) in the device. For Silicon IGBTs, typical designs include Planar with an insulated gate electrode on the emitter main surface, and Trench with an insulated gate electrode included in the recesses formed on the emitter main surface. Both designs can incorporate carrier density enhancement layers for improved plasma concentration.

The basic transistor active cell can have in a top plane view a cellular design or a strip design. A fully functional device will be obtained by structuring numerous basic transistor active cells on the same starting wafer material by using different multi cell arrangements in a top plane view, also called layouts. Typical layouts for power semiconductors are stripe designs, or various closed cell layouts such as square designs, hexagonal cell designs, octagonal, and rectangular cell designs.

It is also possible to combine the advantages of using both trench and/or planar gate electrodes within the same transistor cell, to achieve for example Silicon IGBTs or Silicon Carbide MOSFETs with improved on-state performance, good controllability and low switching losses.

The trend to using narrow separated gate trenches creates well known reported issues. For example, the long-term stability can be influenced due to the high electric fields developing at the corners of the trench gates. Additionally, many narrow trench designs rely on using "dummy" areas at the emitter side, which include p-type doped regions used to enhance the charge carrier plasma concentration in the ON-State. Because it is difficult to extract these electric charges from the p-type doped regions, this generates significant turnoff losses when the semiconductor switches from the ON-state to the OFF-state.

It is needed a design that adopts mesa widths (distance between a trench gate and the adjacent trench gate) in submicron regime to achieve very low conduction losses. Closely packed trench gates can provide a strong barrier to hole drainage, as well as improved reverse bias blocking performance. However, increasing the number of trench gates electrodes will increase the total area of the gate electrodes and thus the Miller capacitance (the parasitic capacitance between gate and collector in an IGBT or between the gate and the drain in a MOSFET). The Miller capacitance becomes large and the switching performance of the transistor (turnoff time, turnoff loss, etc.) is impaired.

It is thus further desirable to identify the optimal means to achieve low switching losses by ensuring low Miller capacitance regardless of the plurality of trench and/or planar gates, by using a method that is easily manufacturable, and does not generate other effects impairing the transistor performance.

SUMMARY

A semiconductor device according to the invention comprises a drift layer of a first conductivity type with a first and a second surface. For lateral type semiconductors, the first and second surface may be substantially on the same side of the drift layer. For vertical type power semiconductors, the first and second surface may be opposite to each other, i.e., spaced apart along a first dimension, also identified as the vertical orientation. First gate electrodes are formed on the first surface embedded in trench recesses distributed according to various striped or cellular patterns. The first gate electrodes are insulated by a first insulation layer from the material of the drift layer. The semiconductor device further comprises one or more active semiconductor cells, each of said active semiconductor cell which comprises a part of the drift layer and source regions of the first conductivity type having a doping density higher than said drift layer, and formed by ion implantation through a source lithography mask, a first base layer of the second conductivity type having a position of highest surface dopant concentration, a second base layer of the second conductivity type embedded in the first base layer, having a doping concentration higher than said first base layer, and emitter electrodes which are formed on the first surface and contact the source regions, and the second base layer through a contact opening or contact plug. The first and second base layers, and the source regions are formed within the first layer adjacent to the first surface, and extend laterally in a second-dimension orthogonal to the first dimension. The first and the second base layers, and the source regions may extend in a top plane view in a third dimension, orthogonal to the second dimension.

When observing in the top plane view, the first gate electrodes are embedded in trench recesses arranged in closely packed stripe layout configurations which can be parallel to the second dimension in this top plane view. The trench recesses are interrupted in their longitudinal direction, such that the first end wall abuts the first base region and the source region, while the opposite end wall abuts a fortified layer of the second conductivity type. In certain locations across the semiconductor, the distance between adjacent trench recesses in the second dimension is increased in order to create a contact opening that allows a first main electrode to be connected to the source region and to the first and second base regions. For stripe designs, a distance between the lateral walls of two adjacent trench gates in the third dimension may be in a range from about 5 µm to below 0.1 µm, more preferably from 1 µm to 0.1 µm and a distance between adjacent trenches in the second dimension extends approximately in a range from about 20 µm to about 1 µm, preferably from 5 µm to 1 µm, and more preferably from 2 µm to 1 µm.

According to a further embodiment, the trench recesses can also be arranged in a radial/circular/hexagonal layout, etc. — more generally defined as closed cellular designs.

According to a yet further embodiment, the semiconductor device comprises a second gate electrode which is arranged on the first surface, said second gate electrode being electrically connected to the first gate electrodes. When a suitable control voltage is applied on the second gate electrode, an inversion layer is formed in the first base layer regions under the second gate electrode, and a planar MOS channel will connect the source region and the drift layer on the first surface of the drift layer. The first gate electrodes are electrically interconnected through the second gate electrode, and no additional gate runners are required.

According to a yet further embodiment, a power semiconductor device comprises also a buffer layer of the first conductivity type with a higher doping concentration than the drift layer, which buffer layer is arranged on the second surface of the drift layer, between the drift layer and an collector electrode; and a collector layer of the second conductivity type, which is arranged on the second surface between the buffer layer and the collector electrode.

According to a yet further embodiment, the walls (lateral/bottom) of the trench recesses have an insulated layer which is significantly thicker in the trench regions that do not abut the first base layer.

The new transistor cell design offers a wide range of advantages both in terms of performance (reduced losses, improved controllability and reliability), and processability (very narrow mesa design rules, reliable process compatibility) with the potential of applying carrier density enhancement layers, or reverse-conducting structures. Due to the fact that the area in between the trench recesses of the first gate electrodes does not need to be further structured, very high-density trench recesses can be used, with trench mesa dimensions reaching below 100 nm. Because of the special orientation of the first gate electrodes, there are no regions of second conductivity type being formed from where it is difficult to extract the charge carriers during the semiconductor switch off process, as is the case for the state-of-the-art semiconductor trench cells. In the ON-state, the hole drainage effect from these regions is reduced by the close packed arrangement of the trench recesses.

The new design can be applied to both vertical and lateral IGBTs and MOSFETs based on silicon or wide bandgap materials such as Silicon Carbide SiC, Gallium Nitride, Zinc Oxide, etc.

Further advantages according to the present invention will be apparent from the dependent claims.

BRIEF DESCRIPTION OF THE DRAWINGS

The embodiments of the invention will be explained in more detail in the following text with reference to the attached drawings, in which.

DETAILED DESCRIPTION

Figure 1A:
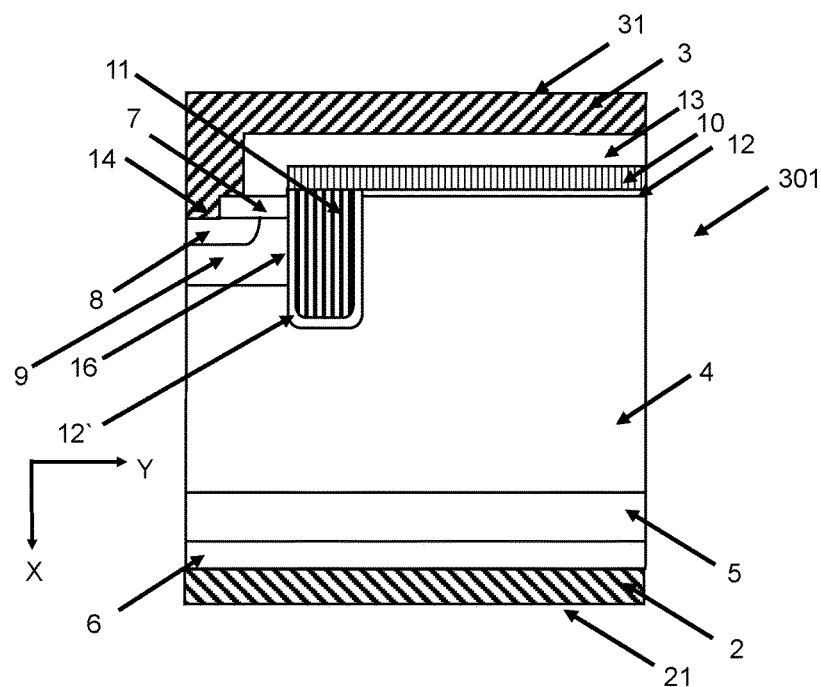
FIG. 1A: shows a cross section of a Trench MOS IGBT (prior art).
Figure 1B:
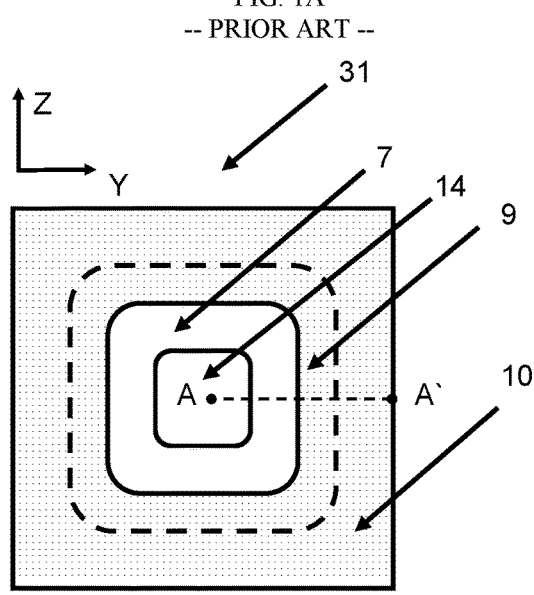
FIG. 1B-C: show top views of a semiconductor device with trench type transistor cell (prior art).
Figure 1C:
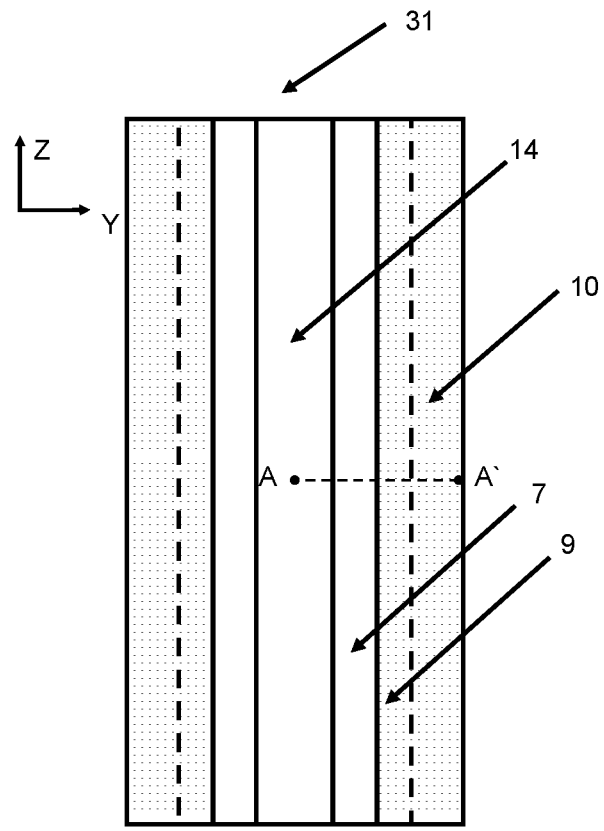
Figure 2:
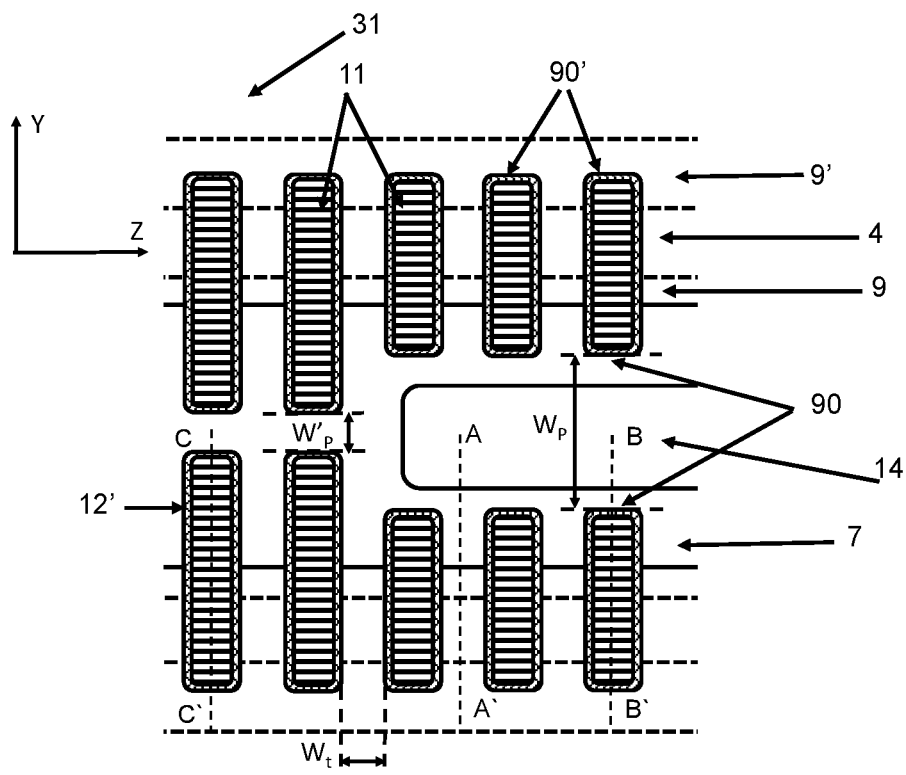
FIG. 2: shows a top view of a semiconductor device according to the first embodiment of the invention.
Figure 3A:
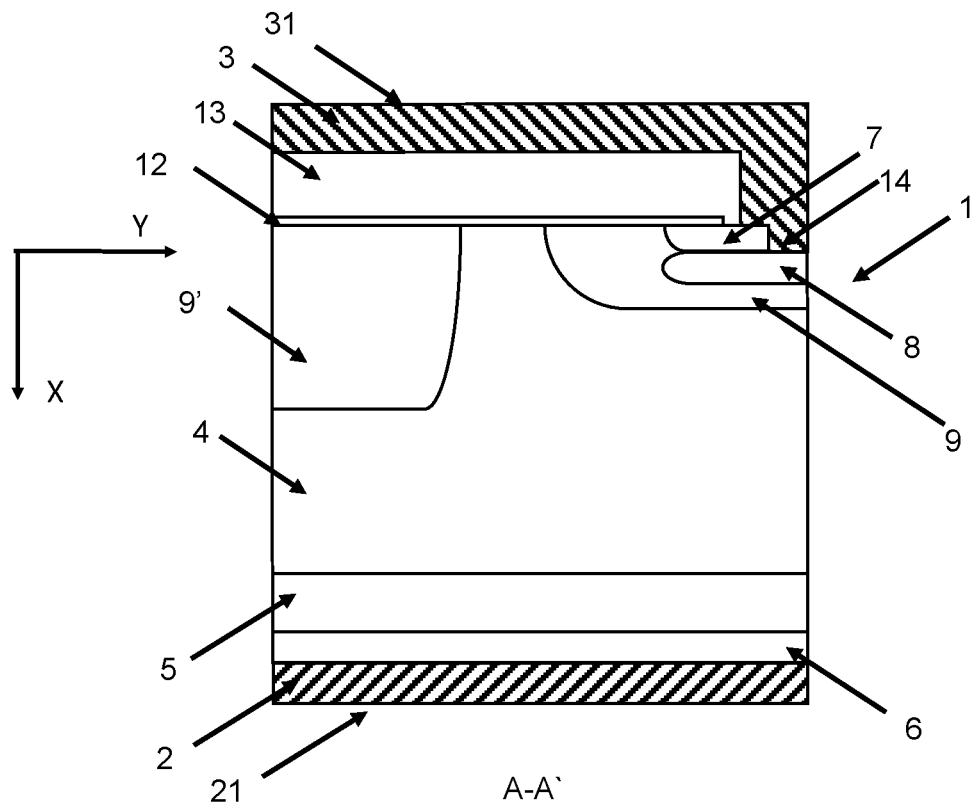
FIG. 3A-C: show cross sections of the semiconductor device along cut lines A-A', B-B' and C-C' in FIG. 2.
Figure 3B:
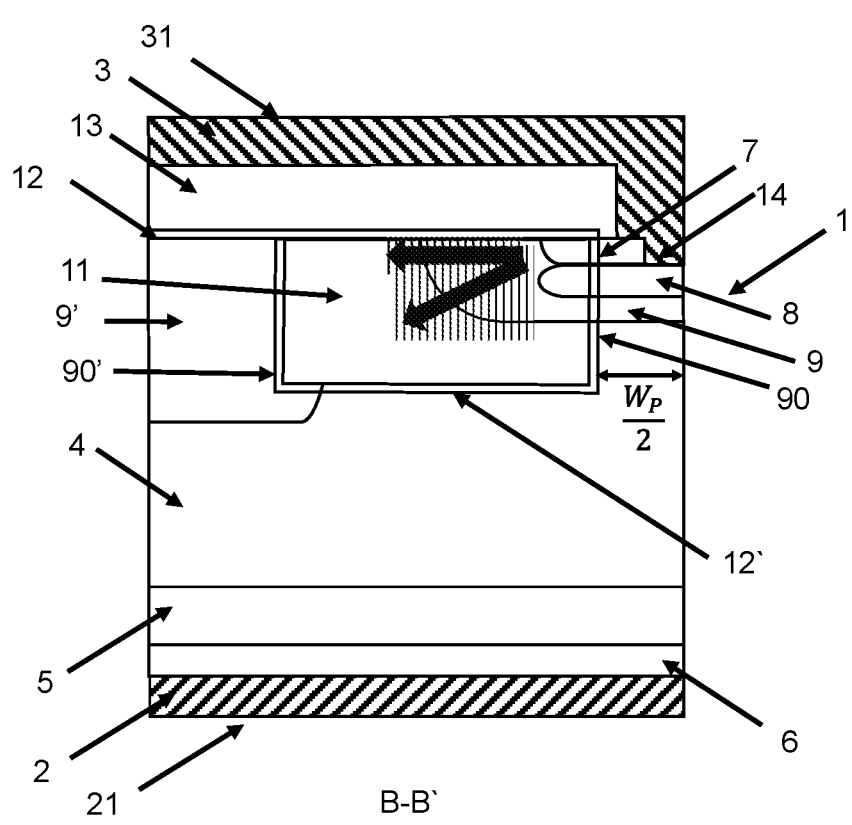
Figure 3C:
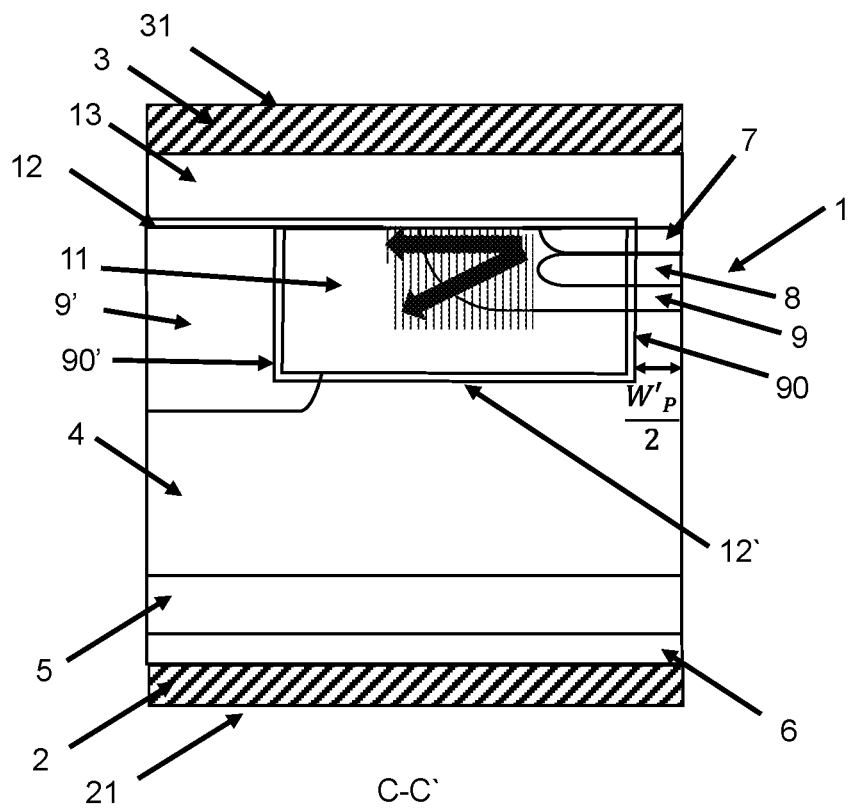

FIG. 2 shows a top plane view of the first exemplary embodiment of a semiconductor transistor cell 1. In a full transistor device, a multitude of transistor cells 1 are arranged on the emitter side 31, adjacent with each other. FIGS. 3A-C show more specific details in cross sections at different cut lines as depicted in FIG. 2, in form of a punch through insulated gate bipolar transistor (IGBT) with a four-layer structure (pnpn). The layers are arranged between an emitter electrode 3 on an emitter side 31 and a collector electrode 2 on a collector side 21, which is arranged opposite of the emitter side 31 in a first direction X, also identified as the vertical orientation. The IGBT transistor cell comprises an (n-) doped drift layer 4, which is arranged between the emitter side 31 and the collector side 21, and a p doped first base layer 9 arranged on the emitter side 31 of the drift layer 4, and extending into the drift layer 4 in the X direction. The transistor cell 1 also comprises an n doped source region 7, which is arranged at the emitter side 31 embedded into the first base layer 9, and directly contacting the emitter electrode 3. The source region 7 has a higher doping concentration than the drift layer 4. Both the source region 7 and the first base layer 9 are shaped as elongated rectangles in a top plane view defined by the Y-Z directions, which are orthogonal to the X direction and together they define the horizontal orientation.

Figure 9:
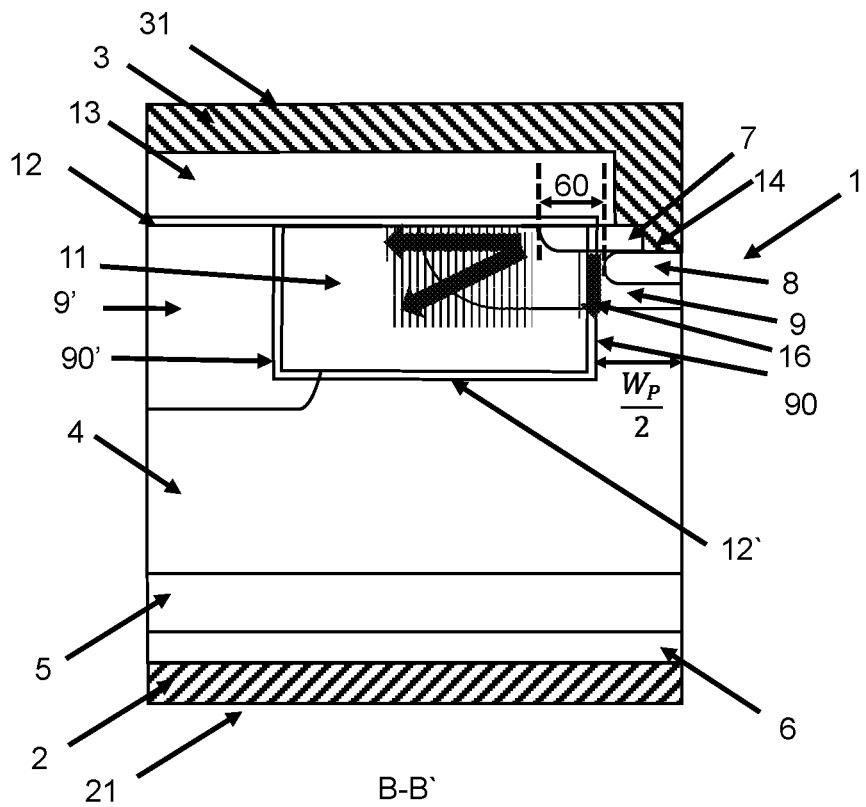
FIG. 9: shows a cross section of a semiconductor device according to a fifth embodiment

The innovative power semiconductor transistor cell 1 further comprises a p doped second base layer 8, which is arranged between the first base layer 9 and the emitter electrode 3, which second base layer 8 is in direct electrical contact to the emitter electrode 3. The second base layer 8 has a higher doping concentration than the doping of the first base layer 9. The second base layer 8 extends in the X direction deeper than the source region, but shallower than the first base layer 9. In the same top plane view, the second base layer 8 is shaped as a rectangle substantially centered on the rectangle of the source region 7. In the direction Y, the position of the edge of the second base layer 8 is spaced apart by a separation region 60 from the position of the edge of the source region 7, when referring to the furthest edges with respect to the position of the contact opening 14. The separation region 60 has a length that can be substantially 0 as represented in FIG. 3A, can be larger than 0 as represented in FIG. 9, or can be negative (not shown).

Furthermore, a plurality of first gate electrodes 11 are embedded in corresponding trench recesses, each electrode 11 being electrically insulated from the surrounding first base layer 9, the second base layer 8, the source region 7 and the drift layer 4 by a first insulating layer 12'. The first gate electrodes 11 extend longitudinally in the Y direction, and are arranged at an angle of 90 degrees with respect to the Z direction, when observed in the top plane view. The trench recesses intersect both the source region 7 and the second base layer 8, i.e., the first end trench wall 90 of the first gate electrodes is arranged in the source region 7.

A second insulation layer 12 is arranged on the emitter side 31, protecting the surface of the drift layer 4, of the first base layer 9 and of the source region 7. The layer 12 can also be used as a masking layer for the implantation of ions forming the source region 7 and the first base layer 9.

The power semiconductor device according to the first exemplary embodiment further comprises a p-doped collector layer 6 arranged between a buffer layer 5 and the collector electrode 2, which collector layer 6 is in direct electrical contact to the collector electrode 2. An n-doped buffer layer 5 is arranged between the collector layer 6, and the drift region 4. A third insulation layer 13 is arranged between the emitter electrode 3, the first gate electrodes 11, and the gate runners 11'.

The emitter electrode 3 and the insulating layer 13 are omitted in most of the Figures showing top plane views, in order to better facilitate the visualisation of the underlaying structures.

With respect to the FIGS. 2A, 3B and 3C, the critical design aspects are the distance $W_t$ or mesa between the trenches of the first gate electrodes 11 in the Z direction, as well as the dimension $W'_p$ representing the distance from a trench end wall 90 of a first gate electrode 11 to a trench end wall 90 of the adjacent first gate electrode in the Y direction. Improved carrier storage/reduced hole drainage is expected as the dimensions $W_t$ and $W'_p$ are reduced. The value of $W_t$ may be in a range from about 5 μm to below 0.1 μm, more preferably from 1 μm to 0.1 μm—which is achievable with the proposed design because no additional structures have to be lithographically defined in between the trench recesses of the first gate electrodes 11. Also, improved carrier storage/reduced hole drainage is expected by reducing the distance $W'_p$. More specifically, $W'_p$ could extend approximately in a range from about 20 μm to about 0.1 μm, preferably from 5 μm to 0.1 μm, and more preferably from 2 μm to 0.1 μm. In order to enable a proper electrical contact between the source region 7, the second base layer 8 and the emitter electrode 3, the distance $W'_p$ is increased in certain regions of the semiconductor, in order to allow a contact opening 14 to be formed. The new distance $W_p$ in these regions could extend approximately in a range from about 2 μm to 0.5 μm, depending on the resolution of the lithography system used during the manufacturing process.

The number of first gate electrodes 11 shown in FIG. 2 is indicative only, and used for clarification purposes, and do not define the exact number of gate electrodes that must be used when designing a real semiconductor transistor 1. The number of first gate electrodes 11 as well as their specific arrangement into groups having a separation distance $W'_p$ and groups having a separation distance $W_p$ will depend on the selected target performance criteria as well as the overall geometrical dimensions of the full semiconductor device. The plurality of first gate electrodes 11 are interconnected using gate runners, a concept known to those experts in the field.

In the first exemplary embodiment depicted in FIG. 2, and cross sections FIG. 3A-C, a voltage applied on the first gate electrodes 11 initiates the formation of an inversion layer in the first base layer 9. If a positive voltage is applied, with a value above a threshold value, the inversion channel is formed only on the lateral trench walls, except in the regions abutting the highly doped second base layer 8, which has higher dopant concentration than the first base layer 9. No surface inversion layer is formed on the emitter side 31 of the first base layer 9.

Due to the plurality of first gate electrodes 11 arranged, according to the first exemplary embodiment, orthogonally to the extension direction of the source region 7 in a top plane view, the Miller capacitance will be increased and will impact especially the turnoff that changes the IGBT from the ON-state or Conductive-state to the OFF-state. When the IGBT is in Conductive-state before the turnoff, a voltage as high as the collector-emitter saturation voltage is applied between the collector electrode 2 and the emitter electrode 3 and many charge carriers are accumulated in the vicinity of the first insulating layer 12'. Therefore, the Miller capacitance is the capacitance of the first insulating layer 12'. As soon as the IGBT turnoff process starts, depletion starts from the vicinity of the pn-junction between the first base layer 9 and the drift layer 4. Immediately after a depletion layer starts expanding, the area of the depletion layer edge is large and the depletion layer width is extremely small. Remaining charge carriers prevent the depletion layer from expanding. Therefore, the Miller capacitance is the largest in the turnoff that changes the IGBT from the ON-state to the OFF-state. Due to the largest Miller capacitance, the turnoff time increases and the collector-emitter voltage rises slowly. Therefore, the switching loss of the transistor increases.

The Miller capacitance increases also in the turn-on that changes the IGBT from the OFF-state to the ON-state. In the blocking state before the turn-on, a sufficiently high voltage is applied between the collector electrode 2 and the emitter electrode 3 and the charge carries are not in the vicinity of the first insulating layer 12' due to a depletion layer formed at the pn junction between the first base layer 9 and the drift layer 4. The depletion layer abuts the buffer layer 5 in the X direction; thus, the width of the depletion layer is substantially the same as a thickness of the drift layer 4. Therefore, the Miller capacitance is small. However, as soon as the turn-on process starts, the depletion layer width is reduced and carriers are injected from the source region 7. Especially as the collector-emitter voltage decreases, the area of the depletion layer increases, and the depletion layer width becomes small. Therefore, the Miller capacitance increases. As a result, the fall (starting point of the decrease) of the collector-emitter voltage is delayed and the switching loss of the transistor is increased. For reducing the switching loss of the transistor by reducing the Miller capacitance, it is thus necessary to include a fortifying p-type region 9' in a wide range. The fortifying regions 9' can be electrically floating, or can be connected to the emitter electrode 3 (or other electrical potentials) through contact regions spaced apart from each other (not shown in Figures).

In the first exemplary embodiment, the fortified region 9' is formed such that the second end walls 90' of the trench recesses of the first gate electrodes 11 abut this region. In the case of Silicon based transistors, where the drift layer 4 is formed of Silicon crystal, the region 9' must extend along X direction to a distance from the side 31 of 2 μm and even more than 3 μm. Such a dopant profile can be achieved through different means, for example by tilted ion implantation through the lateral wall 90'. The fortified region 9' can also be created by ion implantation from the emitter side 31.

When the drift layer 4 is formed of a material of wide bandgap such as Silicon Carbide, Gallium Nitride, Gallium Oxide, etc. the depth of the trench recesses can be smaller than 2 μm or even smaller than 1 μm. In this case, it may be possible to form the region 9' by deep ion implantation such that the highest dopant concentration in this region is located entirely below the surface 31.

The presence of the fortified layer 9' has three major effects on the performance of the semiconductor transistor 1. The first effect is to protect the corner of the trench recesses from the damaging effects of high electric fields that develop in the OFF-state of the transistor. The second effect is to reduce the parasitic capacitance associated with the overlap between the first gate electrodes 11 and the drift layer 4. Thus, the semiconductor device has an overall improved performance when turning on and off between the ON-state and the OFF-state, and the power requirements of the gate driver (directly related to the Miller capacitance) are reduced. The third effect is related to the ease of removal of charge carriers accumulated in the ON-state in the fortifying layer 9'. Unlike today's trench gate semiconductors, the fortifying layer 9' is not isolated from the emitter electrode 3 by trench gates that prevent the flow of charge carriers to the emitter electrode 3 during the transition from the ON-state to the OFF-state, thus increasing the switching losses. In the first exemplary embodiment, there is a direct path to quickly deplete the fortifying layer 9' because the trench gate electrodes 11 are allowing a direct path through the drift layer 4 for the charge carriers to reach the emitter electrode 3.

Figure 4:
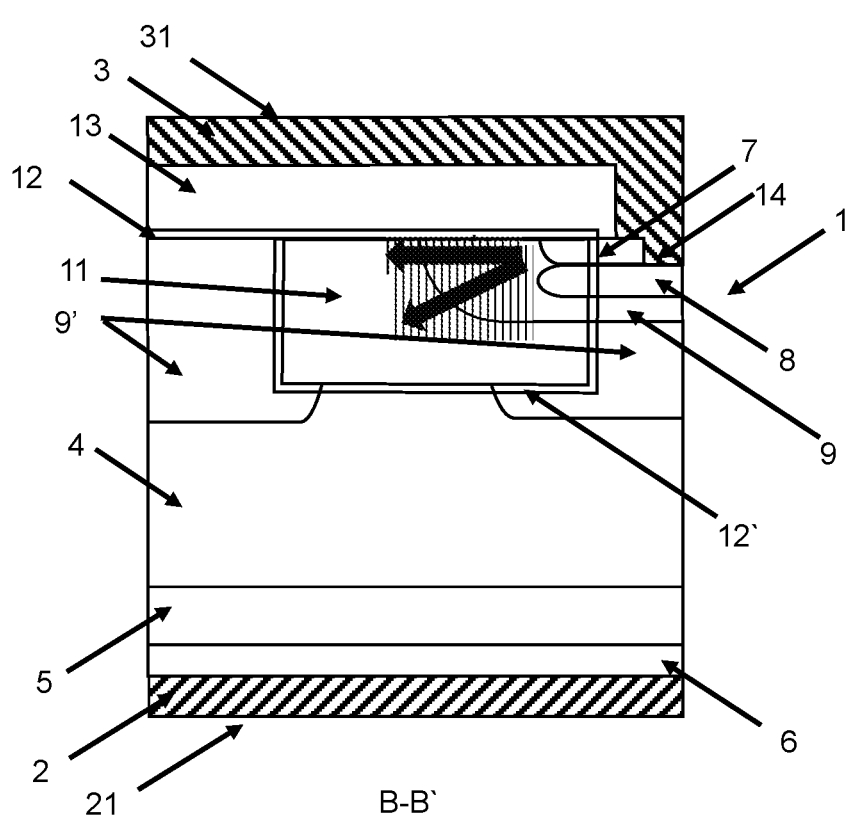
FIG. 4: shows a cross section of a semiconductor device according to a second embodiment of the invention.

In a second exemplary embodiment shown in FIG. 4, both trench walls 90 and 90' are abutting corresponding fortifying regions 9'. One of the benefits of this approach is to protect all corners at the bottom of trench recesses, against high electric fields. The oppositely arranged regions 9' are separated by a portion of the drift region 4 to allow the electrons to flow in ON-state from the source region 7, through the inversion layer formed on the lateral walls of the trench recesses of the first gate electrodes 11, and to enter the drift region 4.

Figure 5:
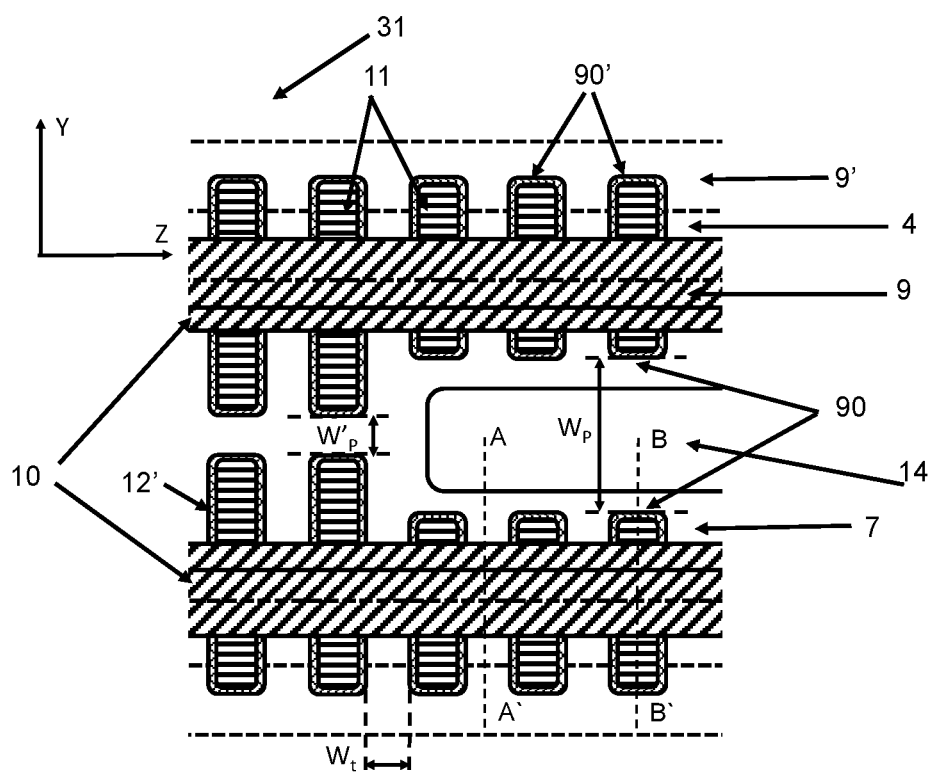
FIG. 5: shows a top view of a semiconductor device according to a third embodiment of the invention.
Figure 6A:
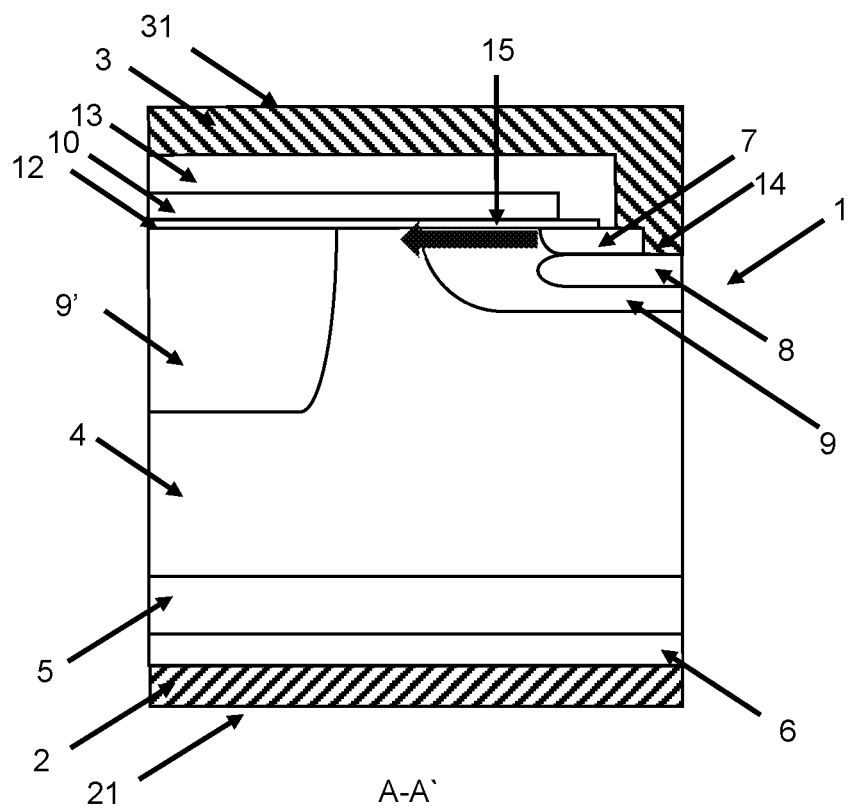
FIG. 6A-B: show cross sections of the semiconductor device along cut lines A-A', B-B' in FIG. 5.
Figure 6B:
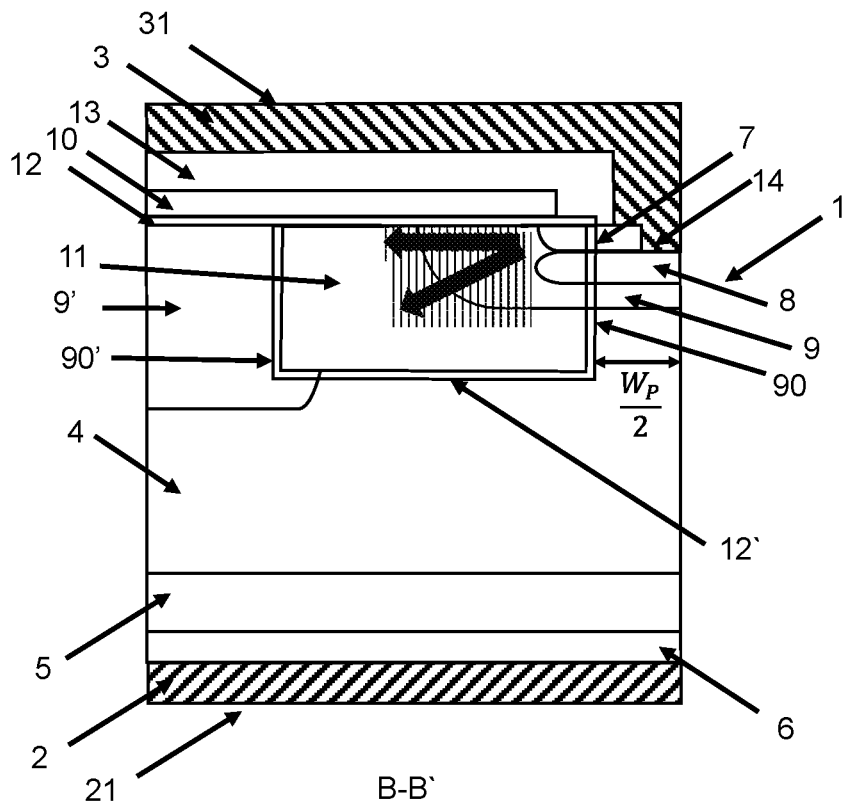

In a third exemplary embodiment shown in FIG. 5, a second gate electrode 10 is formed on the emitter side 31 of the drift layer 4, separated from the drift layer 4, the first base layer 9, and the source region 7 by a second insulating layer 12. The second gate electrode 10 can then ensure the electrical connectivity between the first gate electrodes 11, so that no additional gate runners are required. The advantage of this second exemplary embodiment resides in the formation of an additional planar MOS channel 15 in the transistor cell, at the emitter side 31 in the first base region 9 overlapped by the second gate electrode 10 as shown in the cross-section from FIG. 6A. However, it may be that in certain designs it is desirable to electrically disconnect some of the first gate electrodes 11 from portions of the second gate electrodes 10, in order to optimize certain static or dynamic functional parameters. Another advantage of the third exemplary embodiment resides in simplifying the manufacturing process, in particular reducing the number of masks needed to structure the source region 7 and the first base layer 9. This is because the second gate electrode 10 can also be used as a mask for ion implantation.

Figure 7:
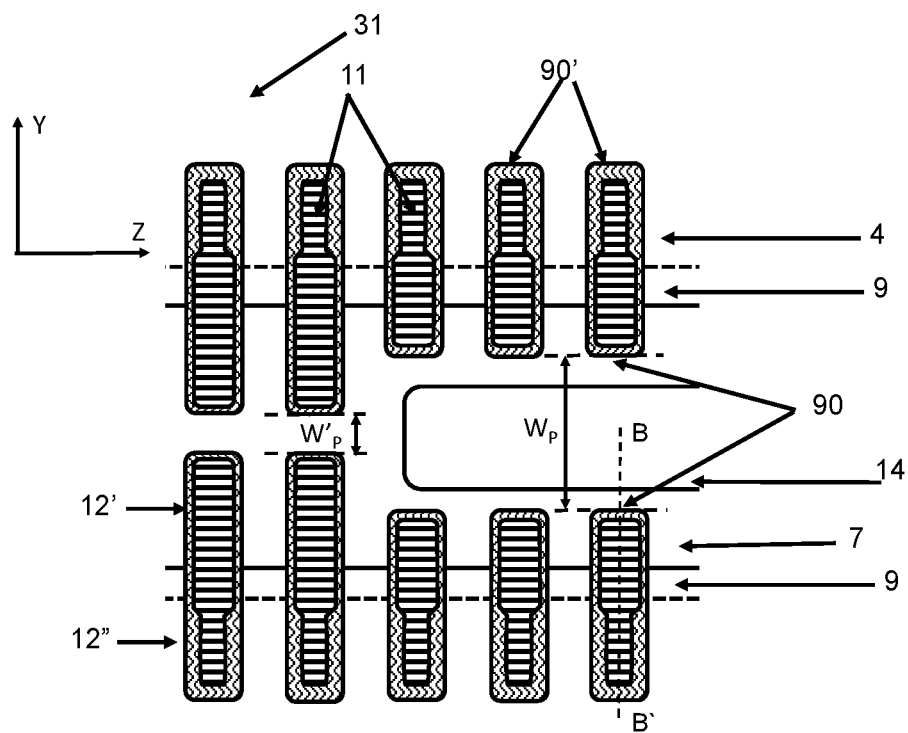
FIG. 7: shows a top view of a semiconductor device according to a fourth embodiment of the invention.
Figure 8A:
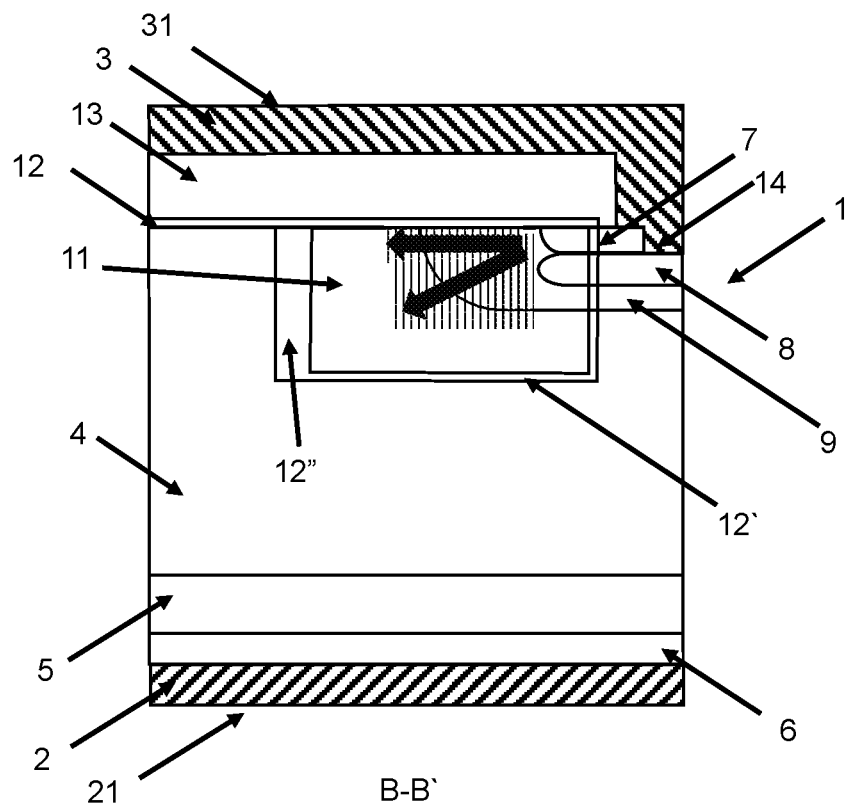
FIG. 8A-B: show cross-sections along cut line C-C' in FIG. 7
Figure 8B:
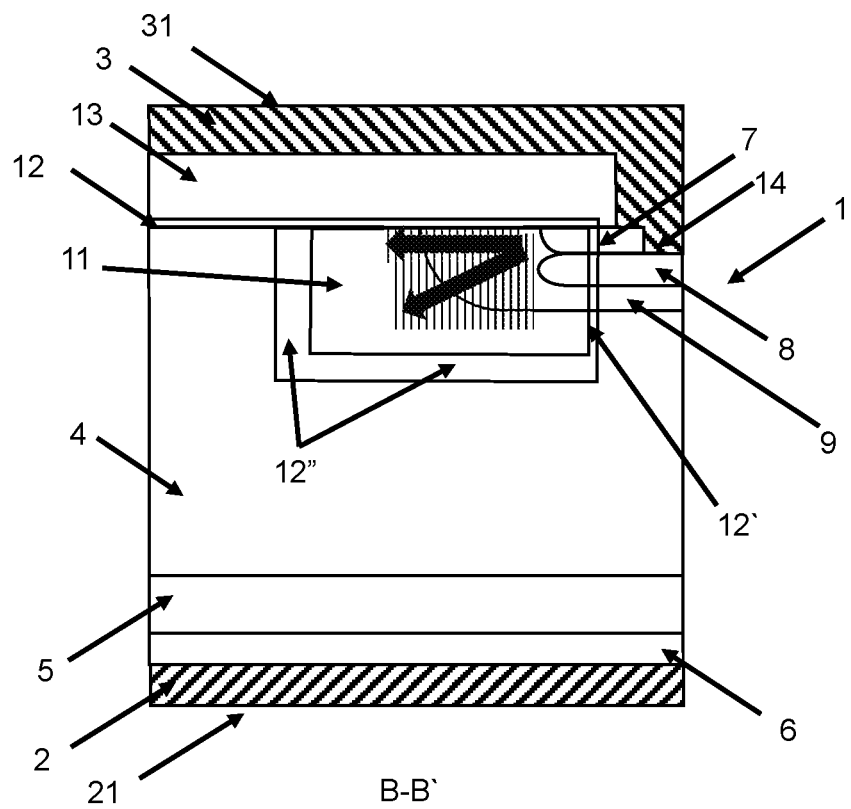

In a fourth exemplary embodiment depicted in FIG. 7, the first insulated layer covering the walls of the trench recesses of the first gate electrodes 11 will have a substantially different thickness in regions that do not abut the first base layer 9. In such an arrangement, the thickness of the first insulated layer 12' is kept at a standard value in the portions of the first insulated layer wherein an inversion layer is formed in the first base layer 9, when a voltage is applied on the first gate electrodes 11. The standard value thickness is dependent on the voltage threshold requirements of the semiconductor device and on the material of the drift layer 4. However, in other portions 12" of the first insulated layer, which are further away from and not abutting the first base layer 9, the thickness of the insulating layer can be increased. In these regions, the parasitic capacitance associated with the first gate electrodes 11 overlapping the drift layer 4 through the first insulated layer 12' will be significantly reduced, as the thickness of the portions 12" is increased. This is better understood in the cross-section depicted in FIG. 8A. The thickness of the insulated layer covering the bottom of the trench recesses can also be made thicker (as shown in the FIG. 8B), in order to further decrease the parasitic capacitances and protect the corners of the trench recesses from the damaging effects of high electric fields.

The first edges of the doped regions defining the source region 7 and the second base layer 8, are defined as being positioned in the Y direction furthermost from the contact opening 14, and closer to the first wall 90 of the first gate electrodes 11. In the above-described embodiments, the first edges of the source region 7 and of the second base layer 8 were substantially formed at the same position in the Y direction and a MOS channel was only formed on the lateral walls of the first gate electrodes 11. However, FIG. 9 depicts a cross section through a fifth exemplary embodiment of the invention, wherein a separation region 60 with a length greater than zero spaces apart, in the Y direction, the first edge of the source region 7 and the first edge of the second base layer 8. The second base layer 8 does not fully protect the bottom side of the source region 7 as indicated in the FIG. 9. In this fifth embodiment, the trench recesses of the first gate electrodes 11 abut the source region 7, but not the second base layer 8. In a similar manner to the first exemplary embodiment, an inversion layer can be formed on the lateral trench walls of the first gate electrodes 11, and additionally a vertical MOS channel 16 is formed on the first end wall 90 of the trench recesses, in regions where the trench recesses abut the first base layer 9. This significantly increases the width of the total MOS channel of the semiconductor device. However, when the length of the separation region 60 is greater than 0, the highly doped second base layer 8 does not fully protect the bottom side of the source region 7, which may impact the Reverse Blocking Safe Operating Area (RB-SOA), i.e., the source region 7 may become forward biased, and may inject electron charge carriers in the drift layer 4, leading to a latch up phenomena. Therefore, a proper optimization of the separation distance 60 must be considering for each semiconductor transistor cell taking into account the trade-offs between electrical performance criteria.

Figure 10:
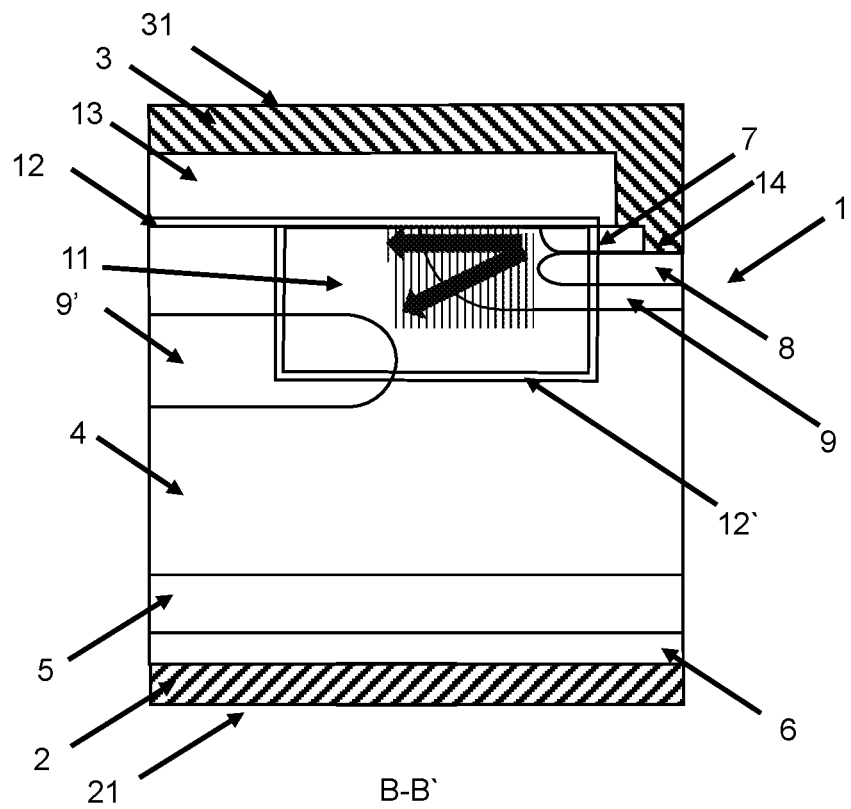
FIG. 10: shows a cross section of a semiconductor device according to a sixth embodiment The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

In a sixth exemplary embodiment depicted in FIG. 10, the fortifying layer 9' is formed such that its highest dopant concentration is localized at a depth in the drift layer 4 comparable to the depth of the trench recesses of the first gate electrodes 11. Such an arrangement can be obtained by using high energy implantation of dopant atoms, and has the advantage of not requiring dopant diffusion/activation of dopants for extended times, in order to obtain a dopant profile extending all the way from the emitter side 31 to the depth of the trench recesses.

In a further embodiment, the extension direction of the first gate electrodes 11 can form other angles different than 90° with respect to the Z direction. This may provide certain benefits if the drift layer 4 is formed of materials with strong dependence between their electrical properties and their crystallographic directions, such as Silicon Carbide.

As described previously, multiple active cells must be arranged on a semiconductor wafer of a starting material to form a fully functional semiconductor device. In addition to the active cells, the fully functional semiconductor device may comprise other regions, such as a junction termination region required for achieving voltage blocking capabilities. In terms of arranging multiple active cells, various layouts can be considered. For example, in addition to the stripe layouts depicted in FIG. 2, 5, or 7, it can be possible to arrange the layers in other shapes, such as squares, hexagons, octagons, etc.

In order to address possible short circuit operating conditions, it can also be possible to structure the transistor active cells 1 in such a manner, that the source region 7 is omitted in between multiple adjacent trench regions of first gate electrodes 11.

The second gate electrode 10 can be electrically grounded or left floating. Consequently, no inversion layer can be formed at the emitter side 31 of the first base layer 9, under the second gate electrode 10. Because there is no electrical connection to the first gate electrodes 11, the operation of the first gate electrodes 11 remains independent from second gate electrodes 10, and follows the same phenomenon as a described previously, with the electrons flowing along the lateral walls 40 of the trench regions when the voltage applied to the gate electrodes 11 is greater than a threshold value.

A further embodiment is a reverse conducting type of power semiconductor, wherein the collector layer 2 can be formed of alternating regions of p doped 6 and n doped 18 material. In this case, there will be a diode formed in parallel with the transistor in the same cell. The performance of the diode part will be heavily influenced by the emitter side structure of the transistor cell. With the embodiments disclosed in this patent application, it will be possible to better control the trade-off performance curves for the diode part, without negatively affecting the transistor part.

In a further embodiment, the drift region 4 can consist of pillars of alternating p-type and n-type doping conductivity, or a so called "charge-compensated" or "superjunction" semiconductor device. Such a semiconductor device, although more difficult to manufacture, can show improvement in the ON-state losses as well as switching losses as the thickness of the drift region 4 can be minimized, and its doping concentration can be increased.

In a further embodiment, a charge carrier enhancement layer can be arranged between the drift layer 4 and the first base layer 9, with the purpose of further enhancing the electron-hole plasma concentration at the emitter side 31. To achieve this effect, the doping of the enhancement layer may be larger than the doping of the drift layer 4.

In other embodiments, the material of the drift layer can be different than Silicon, for example it may be made of Silicon Carbide, Gallium Nitride, Gallium Oxide, Zinc Oxide or the like. In this case, the same embodiments as described above can be applied, however the specific dimensions and dopant profiles have to be adjusted accordingly by means known to experts in the field. More specifically, if the drift layer 4 is made of Silicon material, the trench recesses of the first gate electrodes 11 may extend vertically to a depth approximately in a range from about 2 µm to about 7 µm. The trench width may range from about 3 µm to about 0.5 µm. However, if the drift layer 4 comprises wide band gap materials such as Silicon Carbide or Gallium Nitride or Gallium Oxide or Zinc Oxide, the depth and width of the trench recesses have different dimensions than above, for example the depth can be also smaller than 2 µm.

In addition, for some of the additional embodiments comprising wide bandgap materials, the buffer layer 5 and the collector layer 6 may be omitted, in particular if the power semiconductor device is a MOSFET device with unipolar conduction i.e. majority charge carriers only.

Furthermore, in other embodiments, it can be possible that the power semiconductor is made of a multitude of different transistor cells, but not all cells may be of the same design. For example, the power semiconductor device may be formed with some transistor cells having the first exemplary embodiment, and with some transistor cells having a different design covered in the previous embodiments, or in the prior art.

It is also possible to apply the invention to power semiconductor devices, in which the conductivity type of all layers is reversed, i.e. with a lightly p doped drift layer etc.

In most applications, power semiconductors are not used in bare die form. Therefore, in a further embodiment to this patent application, multiple power semiconductors of any of the previous embodiments may be mounted as single or parallel connected chips on a substrate using techniques such as soldering or sintering. An additional enclosure, protective layers, sensors, and internal/external metal connectors are usually added to form the basis for a power module, with the role of protecting the power semiconductors from damaging environmental factors (mechanical pressure, humidity, high temperatures, electrical discharges etc).

The power modules may be subsequently used in power converters that control the flow of electrical current between a source and a load. The source may be a DC type battery for example, and the load may be an electrical motor. Typical converter topologies that could make use of semiconductor devices with transistor cells according to any previous exemplary embodiments are two-, three- or other multi-level converters, H-bridge or resonant switching.

REFERENCE LIST

1: inventive transistor cell layout for semiconductor devices
3: emitter metallization (electrode)
31: emitter side
2: collector metallization (electrode)
21: collector side
4: drift layer, substrate
5: buffer layer
6: collector layer
7: n source layer
8: p second base layer
9: p first base layer
10: second gate electrode, electrically conductive layer
11: first gate electrode, electrically conductive layer
12: second insulating layer
12': first insulating layer
12": regions of the first insulating layer with increased dielectric thickness
13: third insulating layer
14: emitter contact opening
15: horizontal channel for planar gate
16: vertical channel for trench gate
17: enhancement layer
18: collector shorts
60: separation region between the first edge of the source region, and the first edge of the second base layer (in the Y dimension)
90: first end trench wall
90': second end trench wall
301: trench MOS cell power semiconductor device (prior art)

The invention claimed is:

1. A semiconductor device comprising a semiconductor transistor cell with a first surface and a second surface, wherein a first contact electrode is operatively connected to the first surface and a second contact electrode is operatively connected to the second surface, comprising:
a drift layer located in between the first surface and the second surface extending in a first direction of three orthogonal directions;
a source region of a first conductivity type operatively connected to the first contact electrode through a contact opening, extending longitudinally in a second direction of the three orthogonal directions, with edges defined by a closed form in a top view plane defined by the second direction and a third direction of the three orthogonal directions;
a first base layer of a second conductivity type, opposite the first conductivity type, extending in the first direction below the source region, and with edges extending in the top view plane beyond the edges of the source region;
a second base layer of the second conductivity type embedded within the first base layer and extending in the first direction below the source region, having a doping concentration greater than a doping concentration of the first base layer, having at least a point operatively connected to the first contact electrode via the contact opening;
a plurality of trench regions with trench recesses formed on the first surface of the drift layer, each trench recess comprising a first gate electrode and a first insulating layer, the first insulating layer electrically insulating the first gate electrode from the first base layer, the second base layer, the source region and the drift layer; wherein,
two or more of the trench regions abut the source regions;
the trench regions are shaped with stripes extending at an angle with respect to the second direction;
a subset of the stripes of the plurality of trench regions are separated in their longitudinal extension direction by a distance that is less than 1 µm; and,
a further subset of the stripes of the plurality of trench regions are separated in their longitudinal extension direction by the contact opening;
a fourth layer of the second conductivity type, embedding the trench regions' distal end portions furthest away from the source region;
a second insulating layer on the first surface of the drift layer in contact with the first base layer, the source region and the drift layer; and,
wherein the source region, the first base layer and the second base layer are shaped in the top view plane with a closed polygon.

2. The semiconductor device of claim 1, wherein a fifth layer of second conductivity type embeds the trench regions' end portions closest to the source region, and wherein the fifth layer and the fourth layer are separated by a portion of the drift layer.

3. The semiconductor device of claim 1, wherein the fourth layer has a highest dopant concentration position in the first direction away from the first surface.

4. The semiconductor device of claim 1, wherein the first surface and the second surface are on opposite sides of the drift layer.

5. The semiconductor device of claim 1, wherein the first surface and the second surface are on a same side of the drift layer.

6. The semiconductor device of claim 1, wherein a second gate electrode is formed on the first surface of the drift layer overlapping the plurality of trench regions, contacting at least one of the first gate electrodes at least one point in an overlapping region, and insulated from the drift layer, first base layer and the source region by a second insulating layer.

7. The semiconductor device of claim 1, wherein the edges of the second base layer are aligned with the edges of the source region in the top view plane.

8. The semiconductor device of claim 1, wherein the edges of the second base layer and the edges of the source region in the top view plane are spaced apart by a separation region.

9. The semiconductor device of claim 8, wherein at least one of the plurality of trench regions does not abut the second base layer.

10. The semiconductor device of claim 1, comprising a plurality of transistor cells, wherein the source region is omitted in some transistor cells, so that two or more adjacent trench regions do not abut on a source region.

11. The semiconductor device of claim 1, wherein at least one of the first gate electrodes is electrically connected to the first contact electrode.

12. The semiconductor device of claim 1, wherein at least one of the first gate electrodes is electrically floating.

13. The semiconductor device of claim 1, comprising a plurality of transistor cells wherein:
a buffer layer of the first conductivity type is located between the drift layer and the second surface, wherein a doping concentration of the buffer layer is greater than the doping concentration of the drift layer; and
a collector layer of the second conductivity type is located between the drift layer and the second surface.

14. The semiconductor device according to claim 13, wherein the power semiconductor is a reverse conducting power semiconductor device and comprises a collector layer with alternating regions of first and second conductivity types, formed between the buffer layer and the second contact electrode.

15. The semiconductor device according to claim 1, wherein a sixth layer of the first conductivity type is located between, the drift layer and the first base layer, and wherein a doping concentration of the sixth layer is greater than a doping concentration of the drift layer.

16. The semiconductor device comprising a plurality of transistor cells, with at least one cell according to claim 1.

17. The semiconductor device according to claim 16, wherein at least the drift layer is formed with a wide bandgap material.

18. The semiconductor device according to claim 16, wherein the drift layer is formed with alternating regions of the first and second conductivity types extending in the first direction over more than 50% of a thickness of the drift layer.

19. A semiconductor device comprising a semiconductor comprising a transistor cell with a first surface and a second surface, wherein a first contact electrode is operatively connected to the first surface and a second contact electrode is operatively connected to the second surface, comprising:
a drift layer located in between the first surface and the second surface extending in a first direction of three orthogonal directions;
a source region of a first conductivity type operatively connected to the first contact electrode through a contact opening, extending longitudinally in a second direction of the three orthogonal directions, with edges defined by a closed form in a top view plane defined by the second direction and a third direction of the three orthogonal directions;

a first base layer of a second conductivity type, opposite of the first conductivity type, extending in the first direction below the source region, and with edges extending in the top view plane beyond the edges of the source region;

a second base layer of the second conductivity type embedded within the first base layer and extending in the first direction below the source region, having a doping concentration greater than a doping concentration of the first base layer, having at least a point operatively connected to the first contact electrode via the contact opening;

a plurality of trench regions with trench recesses formed on the first surface of the drift layer, each trench recess comprising a first gate electrode and a first insulating layer, the first insulating layer electrically insulating the first gate electrode from the first base layer, the second base layer, the source region and the drift layer; wherein, two or more of the trench regions abut the source regions;

the trench regions are shaped with stripes extending at an angle from the second direction;

a subset of the stripes of the plurality of trench regions are separated in their longitudinal extension direction by a distance that is less than 1 µm;

a further subset of the stripes of the plurality of trench regions are separated in their longitudinal extension direction by a contact opening; and, the first insulating layer is thicker in the portions of the trench regions that are not abutting the first base layer;

a second insulating layer on the first surface of the drift layer in contact with the first base layer, source region and drift layer; and, wherein the source region, the first base layer and the second base layer are shaped in the top view plane with a closed polygon.

* * * * *